(12) United States Patent
Walther et al.

(10) Patent No.: US 8,340,145 B2
(45) Date of Patent: Dec. 25, 2012

(54) MICROWAVE CIRCUIT

(75) Inventors: Christoph Walther, Bern (CH); Jerome Faist, Zurich (CH); Giacomo Scalari, Zurich (CH); Maria Amanti, Paris (FR); Mattias Beck, Wettingen (CH); Markus Geiser, Zurich (CH)

(73) Assignee: ETH Zurich, Zurich (CH)

( * ) Notice: Subject to any disclaimer, the term of this patent is extended or adjusted under 35 U.S.C. 154(b) by 0 days.

(21) Appl. No.: 13/375,074

(22) PCT Filed: May 31, 2010

(86) PCT No.: PCT/EP2010/057556
§ 371 (c)(1),
(2), (4) Date: Nov. 29, 2011

(87) PCT Pub. No.: WO2010/136605
PCT Pub. Date: Dec. 2, 2010

(65) Prior Publication Data
US 2012/0076164 A1   Mar. 29, 2012

(30) Foreign Application Priority Data

May 29, 2009 (EP) .................... 09007201

(51) Int. Cl.
*H01S 3/14* (2006.01)
*H01S 5/00* (2006.01)
*H01L 29/06* (2006.01)
(52) U.S. Cl. ............ 372/39; 372/45.01; 257/13; 257/14
(58) Field of Classification Search .................. 372/39, 372/45.01; 257/13, 14
See application file for complete search history.

(56) References Cited

U.S. PATENT DOCUMENTS

| 3,675,161 | A | 7/1972 | Teramoto et al. |
| 3,933,323 | A | 1/1976 | Dudley et al. |
| 2006/0152412 | A1 | 7/2006 | Evans et al. |
| 2011/0057206 | A1 | 3/2011 | Sartorius et al. |

FOREIGN PATENT DOCUMENTS

| DE | 10 2007 012475 | 9/2008 |
| JP | 62 257776 | 11/1987 |

OTHER PUBLICATIONS

International Search Report dated Feb. 25, 2011, corresponding to PCT/EP2010/057556.
Hao et al.; "GaN based semconductor devices for terahertz technology"; Terahertz Science and Technology; vol. 1 No. 2; Jun. 1, 2008; pp. 51-64.
Inder Bahl; "Lumped Elements for RF and Microwave Circuits"; Jan. 1, 2003; Artech House; pp. 416-419.
Ohata et al.; "Millimeter wave heterojunction fet monolithic integrated circuits for compact communication systems" Solid State Electronics, vol. 38, No. 9; Sep. 1, 1995; pp. 1589-1594.

(Continued)

*Primary Examiner* — Armando Rodriguez
(74) *Attorney, Agent, or Firm* — Young & Thompson

(57) ABSTRACT

A microwave circuit includes at least one inductive portion and at least one capacitive portion and having a resonance frequency, the microwave circuit including a material which acts as a dielectric for the capacitive portion, characterized in that the material acting as a dielectric includes an active region that is an electrically pumped semiconductor heterostructure having at least two energy levels whose energy separation is close to the resonance frequency of the microwave circuit.

21 Claims, 6 Drawing Sheets

OTHER PUBLICATIONS

Chassagneux et al.; "Terahertz microcavity lasers with subwavelength mode volumes and thresholds in the milliampere range"; Applied Physics Letters, AIP, American Institute of Physics; vol. 90, No. 9; Mar. 1, 2007; pp. 91113-091113.

Masayoshi Tonouchi; "Cutting-Edge Terahertz Technology"; Nature Photonics; 2007; vol. 1 (2); pp. 97-105.

Jerome Faist et al.; The Quantum Cascade Laser has been first demonstrated; 1994; Science AAAS; vol. 264, 553.

Christoph Walther et al.; "Quantum Cascade Lasers Operating from 1.2 to 1.6 THz"; Applied Physics Letters; vol. 74, 3158; 1999.

Marcel Graf et al.; "Terahertz range quantum well infrared photodetector"; Applied Physics Letters; Jan. 26, 2004; vol. 84 No. 4; pp. 475-477.

Arthur C. Gossard; "Wide Graded Potential Wells"; 1994; vol. 40; pp. 153-217.

Kerry J. Vahala; "Optical Microcavities" Nature Publishing Group; Aug. 4, 2003; vol. 424; pp. 839-846.

J. Ulrich et al.; "Temperature dependence of far-infrared electroluminescence in parabolic quantum wells"; Applied Physics Letters; vol. 74; pp. 3158-3160.

Y. Todorov, et al.; "Strong Light-Matter Coupling in Subwavelength Metal-Dielectric Microcavities at Terahertz Frequencies"; Physical Review Letters; May 8, 2009; vol. 102; pp. 186402-1 to 186402-4.

L. Sapienza et al.; "Electrically Injected Cavity Polaritons"; Physical Review Letters; Apr. 4, 2008; vol. 100 pp. 136806-1 to 136806-4.

Schneider et al., "Quantum Well Infrared Photodetectors", Physics and Applications, Springer Series in Optical Sciences, p. 1-250.

MICROWAVE CIRCUIT

TECHNICAL FIELD

The present invention relates to a microwave circuit comprising at least one inductive portion and at least one capacitive portion and having a resonance frequency. The microwave circuit comprises an active material that acts as a dielectric for the capacitive portion.

STATE OF THE ART

The terahertz region of the electromagnetic spectrum (in particular the region 1-10 THz) is called the "terahertz gap" due to the lack of convenient radiation sources. So far, different solutions have been proposed and developed, based on either electronic or optical approaches to obtain terahertz radiation. Tonouchi et al. recite the achieved output powers of electronic and optical approaches in "Cutting-edge terahertz technology", Nature Photonics (2007) vol. 1 (2) pp. 97-105).

So far, no highly efficient and compact device for terahertz generation that works at room temperature has been demonstrated.

Electronic devices are based on oscillators and multiplier chains, which allow generating harmonics up to the terahertz range. They can operate at room temperature, but only with low output power. Moreover, they are bulky because of the different stages.

Regarding the optical approach, it can be distinguished:
  "Large" sources: based on difference frequency generation, mixing and other techniques. They can operate at room temperature, but request a lot of equipment (different laser sources, mixing crystal) implying a large power consumption and low efficiency;
  Quantum cascade lasers: compact semiconductor sources (one compact device): they operate with good output powers, but are still limited to cryogenic temperature.

Nowadays "hot" applications of the terahertz technology include imaging, spectroscopy, local oscillators.

SUMMARY OF THE INVENTION

It is an object of the present invention to provide a microwave circuit with an active region that may be used as a novel kind of terahertz (1 THz=$10^{12}$ Hz) source, in particular, an oscillator for generating oscillations in the range above approximately 0.5 THz.

Depending on the active region used in combination with the microwave circuit of claim 1, different devices are provided.

Using a terahertz quantum cascade active region, a sub-wavelength sized microcavity terahertz laser is provided.

Using an active region of a quantum well intersubband photodetector, a sub-wavelength sized, highly efficient terahertz detector is provided.

Using a parabolic well or a quantum cascade laser active region, a terahertz emitter, able to work at room temperature is provided.

According to another aspect, the emission frequency of a quantum cascade laser operating in a conventional waveguide, combined with a microwave circuit, can be adjusted and controlled by the microwave circuit. E.g. single mode emission can be achieved.

According to yet another aspect, a microwave circuit with the active region of a photovoltaic quantum well intersubband detector can be used to generate electricity.

BRIEF DESCRIPTION OF THE DRAWINGS

The present invention and the corresponding advantages and features provided thereby will be best understood and appreciated upon review of the following detailed description of the invention, taken in conjunction with the following drawings.

DETAILED DESCRIPTION OF THE INVENTION

Lumped Elements

In electronics, the notion of a circuit is a powerful concept in which the electric current is related to the electric potential through the functions of lumped elements (e.g., resistor, inductor, capacitor). This notion has been extensively and successfully used in the radio frequency and microwave domains.

A portion of a circuit is required to be smaller than the wavelength that corresponds to the operation frequency in order to be considered as a lumped element. L is the maximum size of the circuit portion; $\lambda$ is the guided wavelength corresponding to the operation frequency f of the circuit. The criterion is $L<\lambda/4$.

Figure 1:
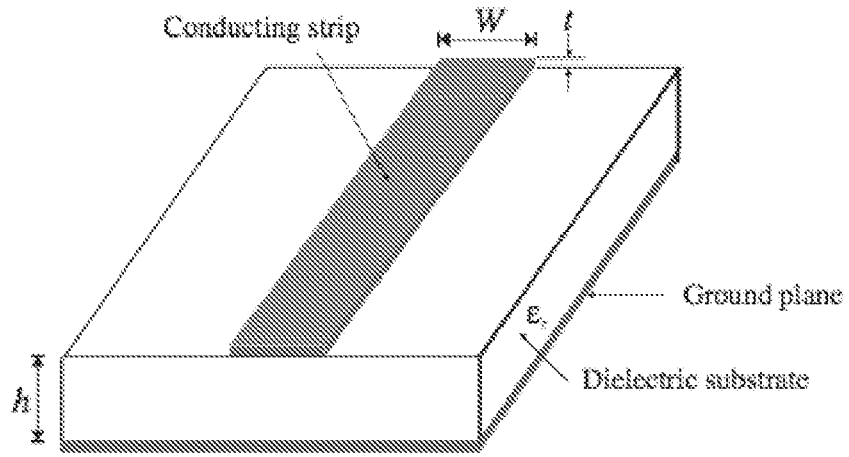
FIG. 1 illustrates a general microstrip-line structure.

One possibility (but not the only one) to fabricate lumped elements at microwave frequency is to use a planar technique, based on microstrip-lines. The typical frequency range is 1-100 GHz (1 GHz=$10^9$ Hz). As shown in FIG. 1, conducting strips on a dielectric substrate, which is on the top of a conducting ground plane, forms the basic geometry of a microstrip-line. Short sections and stubs of a microstrip-line whose length is shorter than ¼ of the guided wavelength act rather as a capacitor or inductor, depending on the geometry. An equivalent electronics circuit can be drawn. A general reference for lumped circuits is for example found in following reference: "Microstrip Filters for RF/Microwave applications", J. Hong and M. Lancaster, Wiley.

Resonant Microwave Circuit with an Active Region

A resonant microwave circuit comprises at a least one capacitor and one inductor. According to the invention, the dielectric of at least one capacitor is substituted by an active region (also called active medium), as it will be defined thereafter. This active region acts as a dielectric. The choice of two capacitors is not stringent, but represents a preferred situation. Any combination of inductors and capacitors, which forms a resonant circuit, is possible. The minimal configuration is one inductor and one capacitor.

Figure 2:
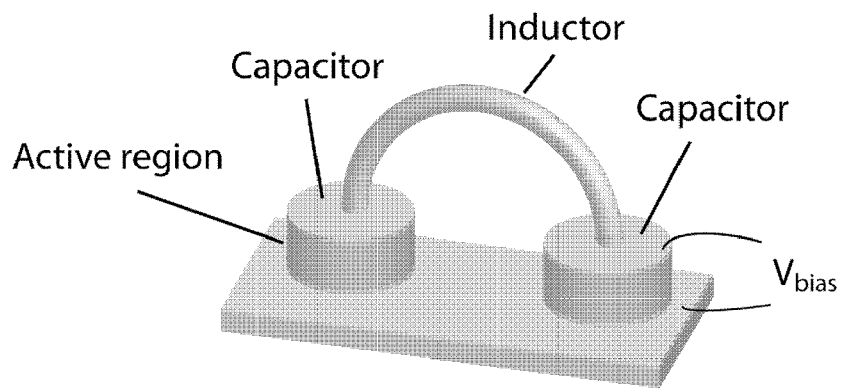
FIGS. 2, 3, 6, 8, 13 and 14 represents schematically different microwave circuits according to the invention, intended to different applications.
Figure 3:
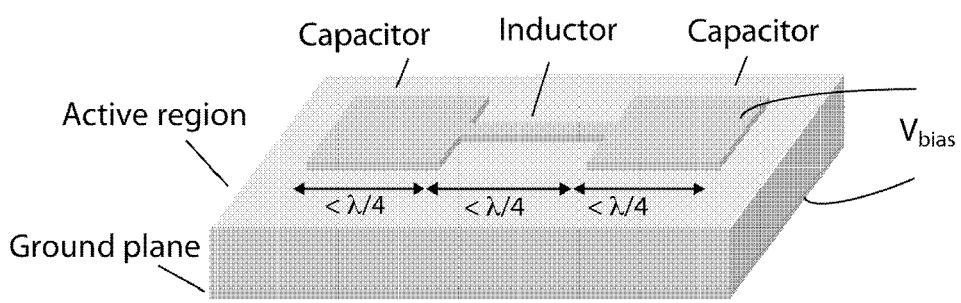

FIGS. 2 and 3 show two possible configurations for the lumped circuit resonator with an active region that comprises one inductor and two capacitors. FIG. 2 shows a resonator that has a bent wire inductor. Such a configuration is preferred for best performance. FIG. 3 shows a resonator that consists of short sections of microstrip-lines. It has a planar inductor. This configuration is simpler and cheaper for fabrication. Other implementations are possible.

Biasing of the Active Region

The active region is biased with a voltage in either continuous mode or pulsed mode operation. The bias can be applied in different ways, leading to different current flows in the active region and resulting in different behaviors of the active region.

Figure 4:
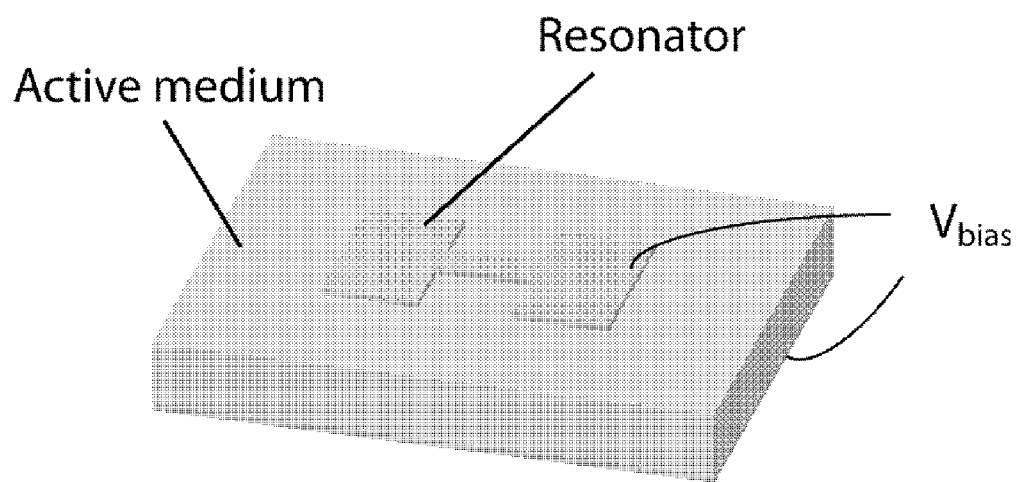
FIG. 4 represents a biasing of the active region perpendicular to the heterostructure layers.
Figure 5:
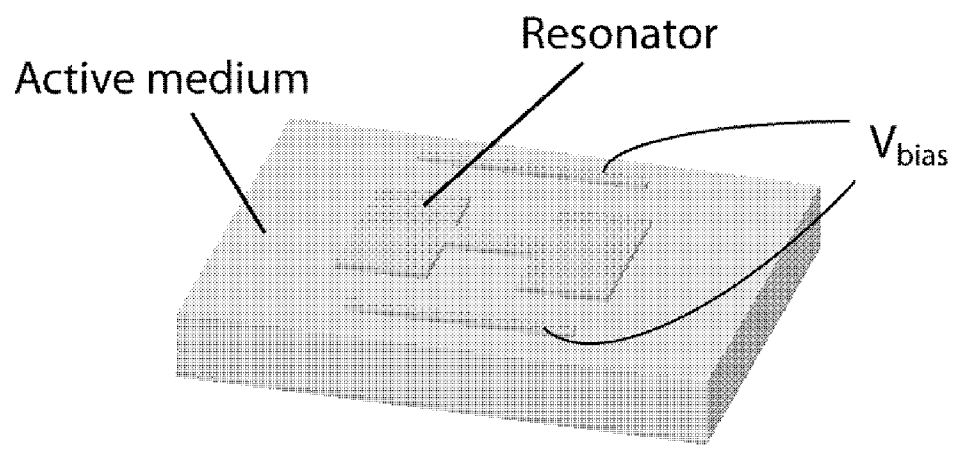
FIG. 5 represents a biasing of the active region parallel to the heterostructure layers.

The most common biasing scheme is through the metallic plates of the capacitor, as illustrated on FIG. 4. It results a bias perpendicular to the heterostructure layers. For some active regions it may be preferred to apply the bias to the active region through lateral electrodes, as represented in FIG. 5. It results a bias parallel to the heterostructure layers.

Active Region

The active region used for all the devices is based on the alternation of two different semiconductor materials, grown by molecular beam epitaxy or metal-organic chemical vapour deposition. Layers are selectively n-doped. The modulation of the conduction band offset results in a quantum potential consisting of a sequence of quantum wells for the n-type carriers. The thickness of the individual layers allows adjusting the properties and behaviour of the structure when biasing with a potential.

The preferred material systems for such heterostructures are GaAs—$Al_xGa_{1-x}As$ where x is typically 0.1-0.3, grown on a GaAs substrate. Also $In_{0.53}Ga_{0.47}As$—$Al_{0.48}In_{0.52}As$ heterostructures grown on InP substrates, or other material systems can be used.

To be used in a microwave circuit according to the invention, the multi-quantum well heterostructure is electrically pumped and it requires at least two quantum levels that are separated by an energy hf (f is the frequency of the light) which is close to the resonance frequency of the microwave circuit.

Practically, the intersubband transition between two quantum levels is not atomically sharp, due to the broadening of the quantum levels. The intersubband transition is characterized by its linewidth, defined as the full width at half maximum of the absorption or emission spectrum of the intersubband transition.

In an analogue manner, the microwave resonator is characterized by a finite linewidth due to the losses in the resonator. The quality factor, a key number of the resonator, gives the ratio of the resonance frequency by its linewidth.

The difference in energy between two energy levels of an intersubband transition is $hf=E_2-E_1$, where $E_2$ is the energy of the upper level and $E_1$ the energy of the lower level. The corresponding frequency of this transition is f and h is the Planck constant. The microwave resonant circuit is characterized by the resonance frequency $f_0$. The frequency f of the intersubband transition is said close to the resonance frequency $f_0$ of the microwave resonator if their frequency difference is within the linewidth of the intersubband transition or the resonator, whatever is larger.

Such a microwave circuit with an active region can be used in several types of applications, which will now be described.

Laser Oscillator

A laser oscillator can be obtained by using a resonant microwave circuit according to the invention, wherein the active region used in the microwave circuit is the active region of a quantum cascade laser.

Such a laser oscillator represents a new way to obtain microcavity lasers, having a mode volume that is much smaller than the cube of the wavelength.

Microcavity lasers are attractive for good mode control, low power dissipation and high modulation speed.

The quantum cascade laser has been first demonstrated in 1994 by J. Faist et al., Science Vol. 264, 553 (1994) and it can be referred to the document EP676839.

In the active region of a quantum cascade laser, energy levels are formed in the multi-quantum well system. Electrons are electrically injected in a higher energy level that is separated by an energy hf (f is the frequency of the laser light) from another energy level. From the latter the electrons can scatter out very fast in the relaxation region that is also formed by energy levels, before that they get injected again in the higher energy level of the following period. A population inversion is established between the higher and lower energy state to achieve lasing.

A laser oscillator with a mode volume that is 3000 times smaller than the cube of its emission wavelength can be demonstrated, based on the microwave circuit according to the invention in combination with the active region of a terahertz quantum cascade laser operating at 1.5 THz.

Figure 6:
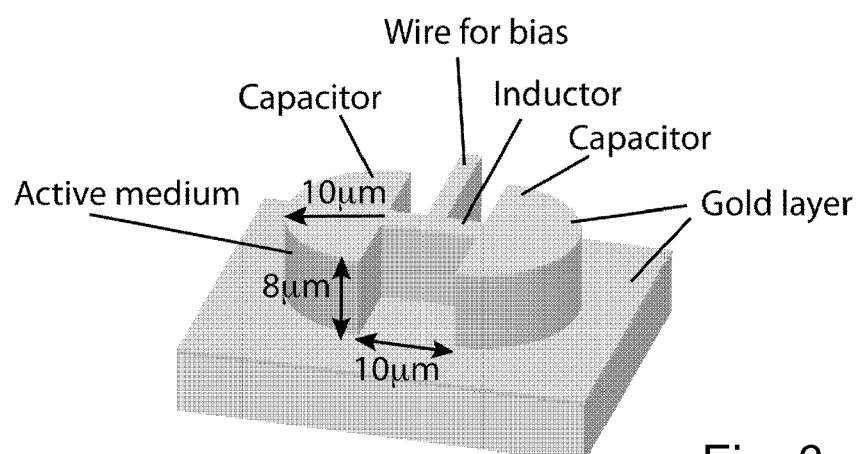

The microwave resonator consists of an inductor and two capacitors in a planar geometry. The capacitors and the inductor can be considered as short microstrip-line sections (shorter than ¼ of the guided wavelength). FIG. 6 shows possible geometrical dimensions of the resonator. As a non limiting example, the active region is 8 micrometer (1 micrometer=$10^{-6}$ meter) thick. The resonator is topped with a 0.350 micrometer thick gold layer and has a ground plane that is about 1 micrometer thick.

The active region used in the resonator is the active region of a quantum cascade laser that has the gain peaked around 1.5 THz, this corresponds to a wavelength of 200 micrometer. It is described in detail in the paper: Walther et al. Quantum cascade lasers operating from 1.2 to 1.6 THz. Appl. Phys. Lett. (2007) vol. 91 (13) pp. 131122.).

The active region is biased by a voltage applied through a connecting wire at the symmetry point of the resonator. The wire is not affecting the high frequency behaviour of the microwave resonator at 1.5 THz.

Figure 7:
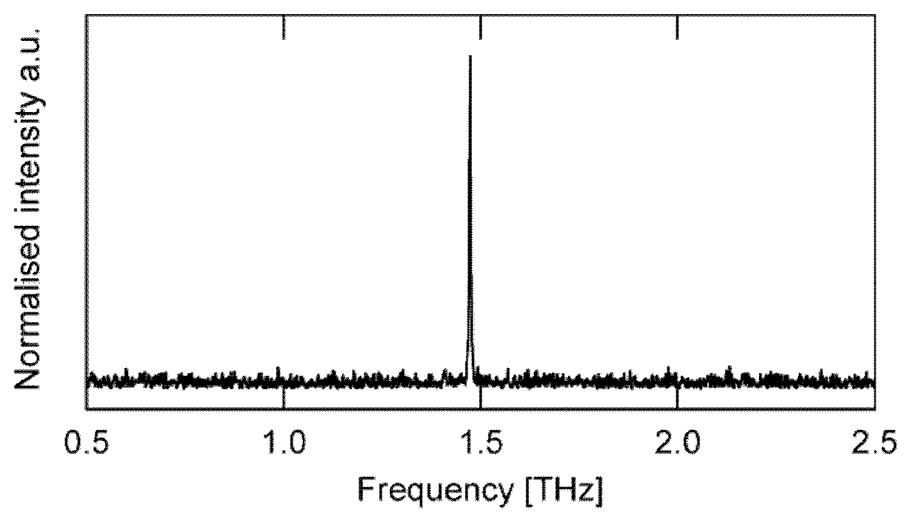
FIG. 7 shows a emission spectra of a terahertz laser oscillator.

The described laser oscillator works at cryogenic temperature. The emission spectra for an applied voltage of 3.3V and 1.5 mA and at 10 Kelvin is shown in FIG. 7.

Frequency Selective Elements for a Single Mode Laser

Single mode lasers in general and single mode quantum cascade lasers in particular are required for many applications. Technically, single mode operation is achieved by implementing a grating by lithographic techniques on the laser ridges. The optical grating filters out one specific frequency. It is difficult to hit a precise frequency; representing large development costs and expensive devices.

The use of one or several lumped circuit resonators in combination with a terahertz quantum cascade laser embedded in a metal-metal waveguide allows for an alternative frequency selection technique by means of electronic filtering. One or several circuit resonator are coupled or embedded in the waveguide; therefore the active region of the circuit resonator is again the active region of a quantum cascade laser.

The circuit resonators are based on a combination of lumped inductors and capacitors and they may behave as electronic filter circuits, allowing only lasing on one frequency.

The tuning of the lasing frequency can be easily achieved by tuning the capacitor or inductor of the lumped circuit elements.

Detectors

For an application as a detector, the microwave circuit according to the invention is used in combination with the active region of a quantum well intersubband photodetector (QWIP) based on a n-type semiconductor heterostructure.

Figure 8:
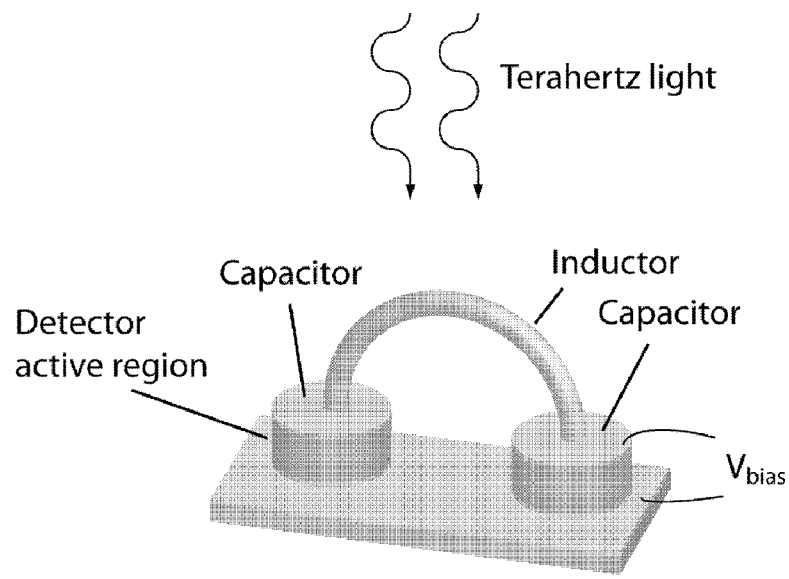

FIG. 8 illustrates the principle of a detector using a microwave circuit and a QWIP active region.

Two kinds of QWIP schemes exist. Photoconductive and photovoltaic QWIP's.

Figure 9:
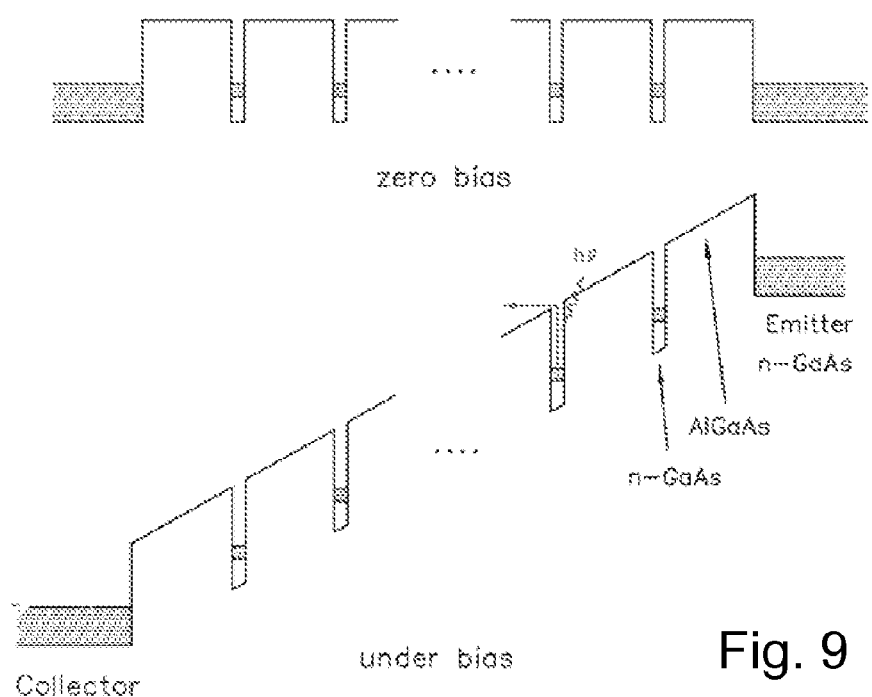
FIG. 9 represents a schematic conduction bandedge profile of a GaAs/AlGaAs photoconductive QWIP under zero (above) and finite (below) bias.

FIG. 9 represents a schematic conduction bandedge profile of a GaAs/AlGaAs photoconductive QWIP under zero (above) and finite (below) bias. The electron population in the n-type wells is provided by the deliberate introduction of donor impurities, for example using Silicon. The emitter and collector contact layers are also made conducting by using donor impurities. The detector is biased with an external voltage and photoemission of electrons from the quantum wells leads to a photocurrent.

Figure 10:
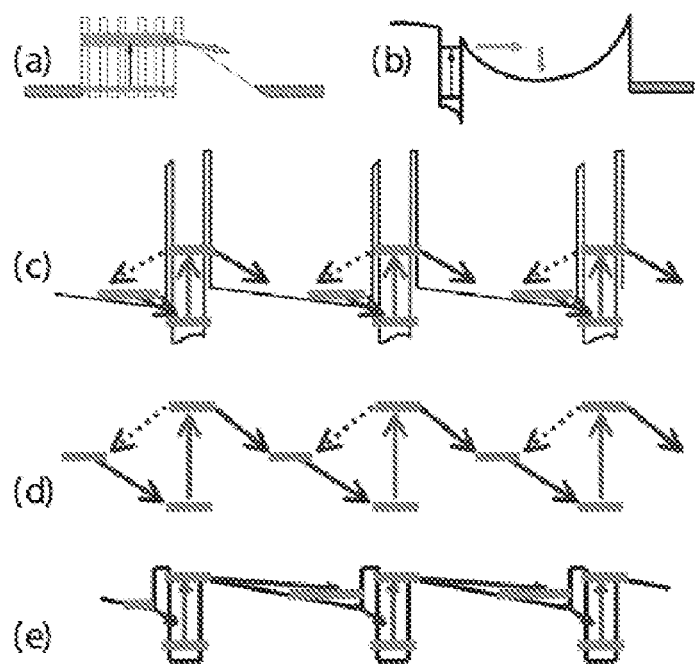
FIG. 10 represents different schemes for the conduction bandedge profile of a photovoltaic QWIP, and FIGS. 11 and 12 propose two schemes of common coupling of light to QWIP's based respectively on incidence at the Brewster angle and at 45 degrees on polished facets.

FIG. 10 represents different schemes for the conduction bandedge profile of a photovoltaic QWIP, based on intersubband transitions. The different transport mechanisms due to photoemission of electrons are shown. Photovoltaic QWIP's can be operated without an external bias; they generate a bias when illuminated.

Those skilled in the art may find further information regarding a recent review on QWIP's in H. Schneider and H. C. Liu "Quantum Well Infrared Photodetectors-Physics and Applications", Springer, Berlin. Quantum well intersubband photodetectors have also been demonstrated in the terahertz range (Applied Physics Letters, Vol 84, 475 (2004)).

An important aspect of QWIP's is the coupling of light to the QWIP active region. For this purpose, the intersubband transition selection rule requires a nonzero polarization component in the quantum well direction (the epitaxial growth direction). In the simplest experimental geometry of shining the incident light normal to the grown wafer, negligible intersubband transition absorption is observed; other coupling geometries must be used.

Figure 11:
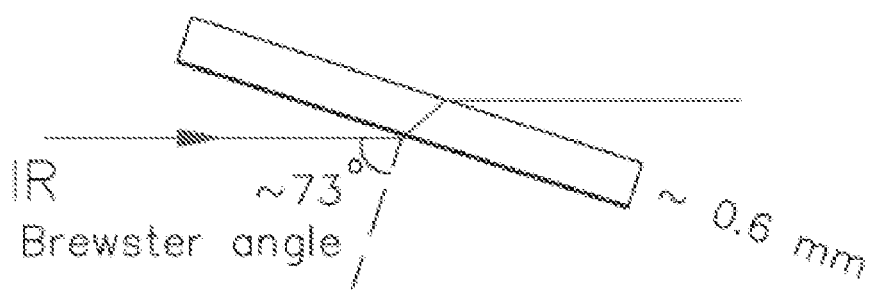
Figure 12:
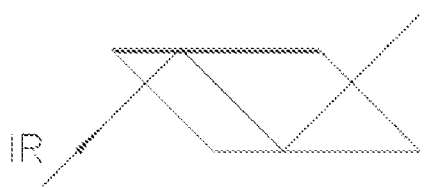

Common coupling schemes are based on incidence at the Brewster angle, or at 45 degrees on polished facets. P-polarized light is completely transmitted at the Brewster angle, shown in FIG. 11. Another common geometry is the 45 degree zigzag waveguide formed by polishing two parallel facets into the substrate (FIG. 12). The length of the waveguide determines during how many double passes the light will interact with the sample.

For the terahertz region, the coupling of radiation to the active region of photodetectors is very inefficient through the usual coupling schemes described above due to the long wavelength (typically 100 micrometer) and the thin active region (typically 5-10 micrometer). The dimension mismatch results in a short effective interaction distance.

Using a microwave circuit according to the invention, with an active region of a quantum well intersubband photodetector allows fabricating detectors for the terahertz region. The resulting device has several important advantages compared to the usual coupling scheme described above:

The light couples at normal incidence. This is a preferred geometry in practice. Coupling occurs through the metallic structure to the resonator (e.g. the inductor). By adjusting the resonator geometry, high coupling efficiency can be achieved. When the inductor has a length of about ¼ of the wavelength, it acts as a magnetic loop antenna, with a high coupling efficiency.

It provides a stronger interaction of light with the active region, since the optical mode of the resonator has a high overlap (80-90%) with the detector active region. It results in a stronger signal for the same active region surface, and reduces noise of the detector.

The obtained detector is smaller than the wavelength allowing for integration into dense arrays. Devices based on the common used coupling schemes described above, are much larger than the wavelength.

The detector is highly frequency selective: the coupling of the light to the resonator is efficient at the resonance frequency of the resonator; non-resonant radiation is not coupled well to the resonator. The resonator acts as a filter for the target wavelength and hence noise reduction is achieved.

Terahertz Emitter

For an application as emitter, the microwave circuit according to the invention is used in combination with an active region that is optimized for emission.

In the present description, an emitter is a light-emitting device, that doesn't generate coherent light like a laser, but narrowband incoherent light. For many applications this is sufficient. The generation of incoherent narrowband radiation may be feasible at room temperature, when relying on one of the two schemes.

The spontaneous emission of radiation of an intersubband transition in a quantum well. The inherently low emission rate can be speeded up, by making use of the Purcell effect, in small volume resonators.

The second scheme is based on the strong-coupling regime of light-matter.

The active region of a Purcell emitter is based on a quantum well system that has two energy levels separated by an energy hf (f is the frequency of the emitted light) from the lower level. Electrons are electrically injected in the higher energy level and extracted from the lower energy level. The emitter is based on the radiative transition from the upper to the lower energy level characterised as spontaneous emission. A population inversion is favourable, but not stringent. The emitter also works with equal populations in the upper and lower energy level.

The active region of a terahertz quantum cascade laser is a suitable active region for a Purcell emitter. In such a configuration, the gain is insufficient to achieve lasing. This may be the case when operating the emitter at room temperature.

Another active region that can be used as the active region of a Purcell emitter is a quantum well with a parabolic potential.

Parabolic wells made of semiconductor heterostructures are well studied in literature (Semiconductors and Semimetals, Vol 40, 153-217 (1994)).

A parabolic well potential is characterized in that the energy separation between any two successive excited states is always the same, hf.

In a terahertz emitter, terahertz radiation is generated through the process of spontaneous emission of radiation from the higher energy level to the lower energy level. The fundamental problem of such a device is the very long lifetime of spontaneous emission (the lifetime of spontaneous emission scales with $1/v^3$, where v is the frequency). In the terahertz region and for typical intersubband transitions, the spontaneous emission lifetime is in the order of microseconds. Non-radiative transitions between the higher energy level and the lower are in the order of a few picoseconds (picosecond=$10^{-12}$ second), therefore the internal efficiency to generate photons is about $10^{-6}$.

Due to the Purcell effect, the spontaneous emission process can be modified when the emitter active region is placed in a cavity or resonator that has a very small volume for the optical mode and a large quality factor. In such a situation, the spontaneous emission process is speeded up, and hence the efficiency of photon generation is increased (for example: K. Vahala, Nature, Vol 424, 839 (2003)).

The mode volume must be significantly smaller than the cube of the wavelength, preferably smaller by a factor of 100'000-10'000'000. Unlike optical cavities used previously for terahertz emission (for example Applied Physics Letters, vol 74, 3158 (1999)), the microwave circuit of claim 1 may be engineered sufficiently small that the spontaneous emission process is speeded up significantly.

Figure 13:
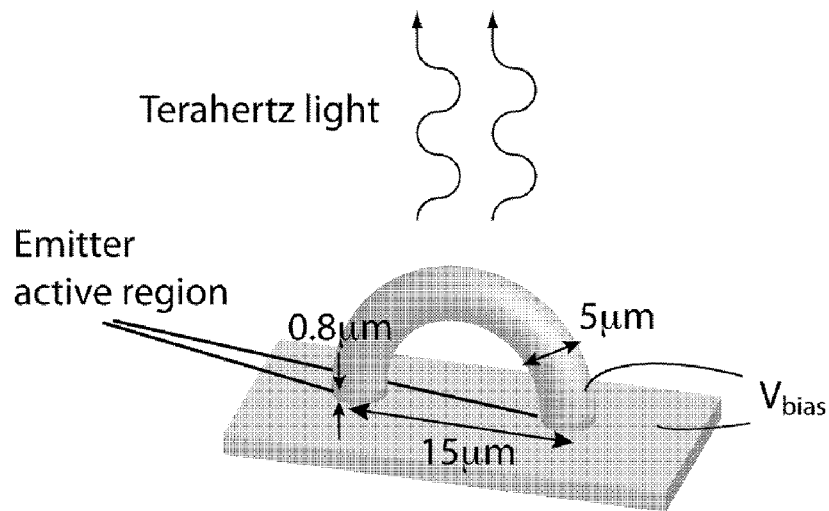

The following example illustrates such an emitter. Assuming an active region that has two energy levels, separated by an energy corresponding to 1.5 THz. The upper and lower energy levels are assumed to be equally populated. This active region is used in a microwave circuit that is optimized for a small mode volume. An example of such an emitter is proposed in FIG. 13.

An enhancement of the spontaneous emission rate by a factor of about 2000 is computed due to the small mode volume of the microwave circuit. The spontaneous emission lifetime in the active region material is computed to be 30 microseconds, but it reduces to 15 nanoseconds due to the microwave circuit. The non-radiative transition from the higher to the lower energy level is estimated to be in the order of 5 picoseconds. The internal quantum efficiency for photon generation is in the order of $3 \times 10^{-4}$, and the outcoupling efficiency of photons is for this microwave circuit about 30%, leading to a total terahertz generation efficiency in the order of $10^{-4}$. The Emission is narrowband, with a linewidth of only 20 Ghz at a frequency of 1.5 THz. A skilled person can optimize this example to get larger efficiencies.

Although the overall efficiency seems low, it is comparable to the efficiency of terahertz generation with other means. Since large arrays of such emitters can be integrated into a semiconductor chip, it represents a simple, small and cheap terahertz generation technique.

A different approach for generation of terahertz emission and to overcome the fast non-radiative relaxation times is based on the strong light-matter interaction of an intersubband transition in a microcavity.

In the strong coupling regime the excitation dynamics of the system can be dominated by the vacuum Rabi oscillation frequency rather than by the non-radiative relaxation rate.

Strong light-matter interaction has been observed at low temperature in the terahertz regime, by means of reflectance spectroscopy, in a two-dimensional electron gas coupled to a cavity photon mode. The corresponding light-matter excitations are called intersubband polaritons. (Physical Review Letters, Vol. 102, 186402 (2009)).

To build a light emitter for the terahertz, based on the strong coupling regime, the problem of current injection into the polaritonic system must be solved. It is a topic of intense experimental research, first results have been obtained at mid-infrared frequencies (Physical Review Letters, Vol. 100, 136806 (2008)).

Figure 14:
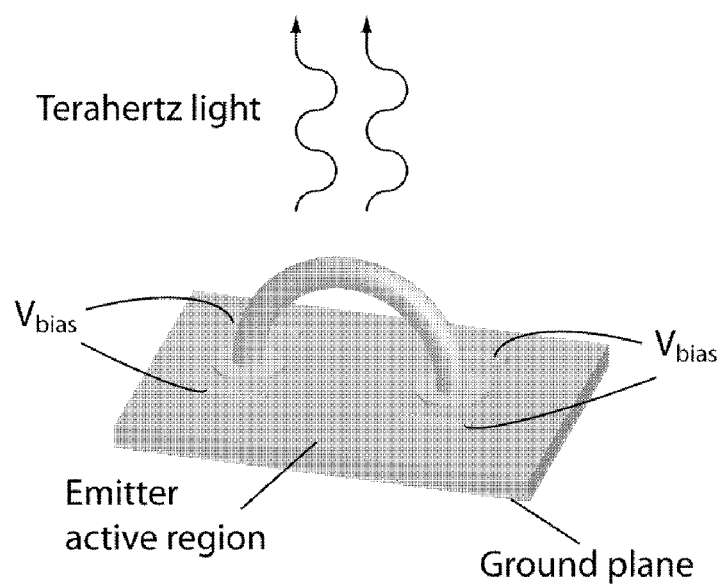

Another aspect of the invention concerns intersubband polariton emission at room temperature using as a parabolic well active region in combination with a microwave circuit according to the invention. The electrons can then be injected in this polaritonic system. By using lateral electrodes (FIG. 14), a current can be injected parallel to the heterostructure layers, allowing an energy transfer to the polaritonic system.

Even if practical experimentation has not been carried out yet, emission of terahertz radiation should be observable at room temperature.

Solar Cells

The microwave circuit according to the invention can be used in combination with an active region of a photovoltaic quantum well intersubband photodetector (QWIP), as a voltage generator as mentioned above.

A large amount of voltage generators can be coupled together in series or in parallel to work as a solar cell.

The invention claimed is:

1. A microwave circuit comprising at least one inductive portion and at least one capacitive portion and having a resonance frequency, the microwave circuit comprising a material which acts as a dielectric for the capacitive portion, wherein the material acting as a dielectric comprises an active region that is an electrically pumped semiconductor heterostructure having at least two energy levels whose energy separation is close to the resonance frequency of the microwave circuit.

2. The microwave circuit according to claim 1, wherein said heterostructure is an alternation of two different semiconductor materials, selectively n-doped, the modulation of the conduction band offset resulting in a quantum potential consisting of a sequence of quantum wells for the n-type carriers.

3. The microwave circuit according to claim 2, wherein the heterostructure is made with materials chosen among GaAs-$A_xGa_{1-x}$As where x is typically 0.1-0.3, grown on a GaAs substrate, or $In_{0.53}Ga_{0.47}As$-$Al_{0.48}In_{0.52}As$ grown on InP substrates.

4. The microwave circuit according to claim 1, wherein the active region is a gain medium capable of serving as the active region of a quantum cascade laser.

5. The microwave circuit according to claim 4, wherein said active region is specifically adapted to be alimented with a bias current to bring the active region into lasing mode.

6. The microwave circuit according to claim 1, wherein the microwave circuit has a resonance frequency between 0.5 THz and 100 THz.

7. The microwave circuit according to claim 6, wherein the inductive portion has an inductance L, the capacitive portion has a capacitance C, and the resonance frequency of the circuit is $1/(2\pi\sqrt{(LC)})$.

8. The microwave circuit according to claim 1, wherein said active region is alimented with a bias current applied parallel to the heterostructure layers.

9. The microwave circuit according to claim 1, wherein said active region is alimented with a bias current applied perpendicular to the heterostructure layers.

10. The microwave circuit according to claim 5, wherein the active region is emitting at the resonance frequency of the microwave circuit.

11. The microwave circuit according to claim 10, wherein the active region is specifically adapted to be alimented with a bias current to bring the active region into emission mode.

12. The microwave circuit according to claim 4, wherein the active region is absorbing at the resonance frequency of the microwave circuit.

13. The microwave circuit according to claim 12, wherein said active region is specifically adapted to be alimented with a bias current to bring the active region into the absorption mode.

14. The microwave circuit according to claim 1, wherein the active region consists of parabolic wells.

15. A light emitting diode (LED) comprising the microwave circuit according to claim 1.

16. A quantum cascade laser comprising a microwave circuit according to claim 1, wherein the active region of the material acting as a dielectric acts as the active medium of the laser.

17. The quantum cascade laser of claim 16, wherein the laser has an emission frequency, the emission frequency being adjustable by adjusting the geometry of the inductive and/or the capacitive portion of the microwave circuit.

18. A light emitting device comprising the microwave circuit according to claim 1.

19. A detector comprising the microwave circuit according to claim 1.

20. Solar cell comprising at least a voltage generator based on a microwave circuit comprising at least one inductive portion and at least one capacitive portion and having a resonance frequency, the microwave circuit comprising a material which acts as a dielectric for the capacitive portion, wherein the material acting as a dielectric comprises an active region that is a voltage generator semiconductor heterostructure having at least two energy levels whose energy separation is close to the resonance frequency of the microwave circuit.

21. The microwave circuit according to claim 1, wherein the microwave circuit has a resonance frequency between 1 THz and 10 THz.

* * * * *